(12) United States Patent
Paillet et al.

(10) Patent No.: US 7,386,080 B2
(45) Date of Patent: Jun. 10, 2008

(54) HIGH-SPEED DATA SAMPLER FOR OPTICAL INTERCONNECT

(75) Inventors: Fabrice Paillet, Hillsboro, OR (US); Tanay Karnik, Portland, OR (US); Jianping Xu, Portland, OR (US)

(73) Assignee: Intel Corportion, Santa Clara, CA (US)

( * ) Notice: Subject to any disclaimer, the term of this patent is extended or adjusted under 35 U.S.C. 154(b) by 760 days.

(21) Appl. No.: 10/673,218

(22) Filed: Sep. 30, 2003

(65) Prior Publication Data

US 2005/0069070 A1    Mar. 31, 2005

(51) Int. Cl.
*H04L 7/00* (2006.01)
(52) U.S. Cl. ..................................... 375/355
(58) Field of Classification Search ............. 375/326, 375/327, 328, 355, 371–376; 327/9, 141, 327/144; 368/202
See application file for complete search history.

(56) References Cited

U.S. PATENT DOCUMENTS

| | | | | |
|---|---|---|---|---|
| 5,400,370 A | * | 3/1995 | Guo | 375/371 |
| 6,044,122 A | * | 3/2000 | Ellersick et al. | 375/360 |
| 6,606,365 B1 | * | 8/2003 | Chen | 375/376 |
| 6,760,389 B1 | * | 7/2004 | Mukherjee et al. | 375/326 |
| 2002/0107670 A1 | * | 8/2002 | Sugai | 702/189 |
| 2003/0055854 A1 | * | 3/2003 | Choudhary | 708/300 |
| 2003/0086339 A1 | * | 5/2003 | Dally et al. | 368/202 |
| 2004/0030513 A1 | * | 2/2004 | Kocaman et al. | 702/79 |
| 2004/0091073 A1 | * | 5/2004 | Smith et al. | 375/355 |

* cited by examiner

*Primary Examiner*—Don N Vo
(74) *Attorney, Agent, or Firm*—Ked & Associates, LLP

(57) ABSTRACT

A system and method for sampling a data stream generates a number of clock signals having equally spaced phases and then samples a data stream using the clock signals. The clock phases are preferably based on a predetermined fraction of a data rate frequency of the data stream, and sampling is performed based on predetermined combinations of the clock signals. While the system and method is suitable for sampling data transmitted for a wide variety of data rates, the system and method is especially well-suited to sampling at data transmitted at high rates, for example, equal to or greater than 20 Gb/s.

34 Claims, 9 Drawing Sheets

A = SAMPLING PERIOD 1
B = SAMPLING PERIOD 2
C = SAMPLING PERIOD 3
D = SAMPLING PERIOD 4
E = SAMPLING PERIOD 5
F = SAMPLING PERIOD 6
G = SAMPLING PERIOD 7
H = SAMPLING PERIOD 8

HIGH-SPEED DATA SAMPLER FOR OPTICAL INTERCONNECT

BACKGROUND OF THE INVENTION

1. Field of the Invention

This invention relates to a system and method for sampling data in applications including but not limited to high-speed data communications.

2. Description of the Related Art

Digital communication systems operate by sampling an analog signal carried over any one of a variety of transmission media. The transmission medium may be a wire line, an optical fiber, or the air in the case of wireless communication systems. As technology advances, faster data rates will be required in order to satisfy new applications. To be compatible with these applications, digital systems must be able to accurately sample analog signals transmitted at the increased data rates.

SONET networks are a preferred type of high-speed optical communication system in use today. In order to sample signals from these networks, an optical interconnect system is usually employed. In such a system, an optical data stream is converted into an electrical signal and then amplified and sampled.

This sampling operation can be easily performed at low speeds (typically less than 10 Gb/s per channel) by conventional systems using, for example, a flip-flop controlled by a recovered clock at the data rate frequency. Sampling, however, becomes increasingly problematic when the setup time of the flip-flop becomes a significant portion of the duration of a transmitted symbol.

For example, at 20 Gb/s, the symbol duration is 50 ps which means the sampling window itself is about 20 ps, taking a 15 ps slope into consideration. Because flip-flops typically exhibit setup and hold times of 10 ps or above, they cannot be used to reliably sample data streams at faster data rates, e.g., 20 Gb/s or above. Moreover, the converted signal output from the front-stage amplifier of these conventional systems is an analog signal that does not necessarily reach determined logical levels with any degree of consistency. This may be attributable to optical power variations which make it difficult to reliably sample data using a flip-flop.

Optical systems are by no means the only ones that suffer from these drawbacks. Other types of communication systems also experience unacceptable performance when attempting to sample high-speed data streams.

DESCRIPTION OF THE PREFERRED EMBODIMENTS

Figure 1:
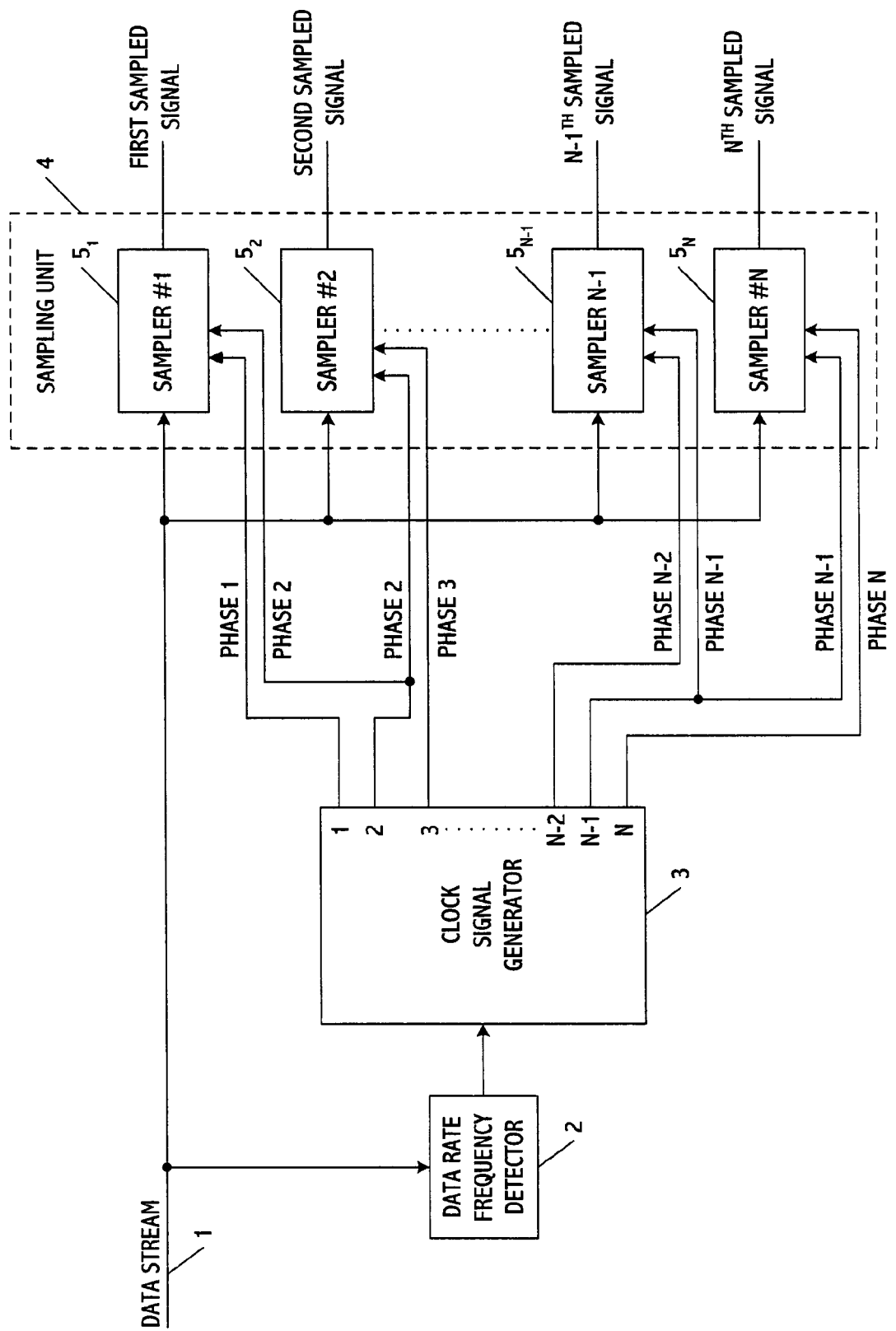
FIG. 1 is a diagram showing a first embodiment of a sampling system in accordance with the present invention.

Referring to FIG. 1, a system for sampling a data stream in accordance with a first embodiment of the present invention includes a signal line 1, a detector 2, a clock signal generator 3, and a sampling unit 4. The signal line carries an input data stream to be sampled. This stream may include data of virtually any type. If the stream includes wireless data, the data may conform to any one of a variety of communications standards including CDMA, GSM, TDMA, 3G, etc. The stream may also include non-return-to-zero type data. In one particularly advantageous application discussed in greater detail below, the stream includes optical data. This data may be of a type read from a storage medium such as a compact disk, transmitted through an optical fiber, or wirelessly transmitted in infrared form.

The detector 2 performs the function of detecting a data rate frequency of the data stream carried on the signal line. This may be accomplished, for example, by detecting a clock signal transmitted with the stream over a separate channel. Once received, the clock signal may be used as a basis for determining the data rate frequency of the stream, which is then used to generate phase signals for controlling sampling.

In circumstances where a clock signal is not transmitted over a separate channel, the data rate frequency may be determined from clock information recovered from the data stream. For example, when the data stream includes non-return-to-zero data, a circuit which uses a phase-detector-controlled VCO (voltage-controlled oscillator) may be used to recover clock information from the stream. While a VCO-based circuit may be preferable for these purposes, those skilled in the art can appreciate that other recovery circuits may be used for recovering the clock information from the data stream. Once the clock information is known, the data rate frequency may be determined and a clock signal generated that is in synchronism with the data stream.

In either case, the recovered or separately transmitted clock may be considered as having a frequency that corresponds to the data rate of the data stream divided by two. Once computed in this manner, the data rate frequency may be used as a basis for generating phase signals for controlling sampling.

The clock signal generator 3 generates a predetermined number of clock signals having phases based on the data rate frequency of the input stream. The clock signals are preferably generated to have equally spaced phases; that is, each consecutive pair of clock signals are separated by the same phase value. This phase value may be determined in various ways. One way involves determining the phase value based on the total number of phases to be generated by the clock generator. This number N may be a predetermined value or may be determined by the detected data rate of the input stream. In FIG. 1, N is illustratively shown as equal to 8. Under these circumstances, the clock generator would generate 8 clock signals having consecutive phases separated by $\theta=45°$, as shown in the phase chart of FIG. 2.

The frequency of each clock signal may be determined based on the same information, e.g., based on the total number of clock phases to be generated. For example, in FIG. 2, the frequency of each clock signal may be computed by dividing the detected data rate frequency of the incoming data stream by N. In this case, each clock signal would have the same frequency.

As a further example, consider the case where the recovered or transmitted clock is determined to have a frequency equal to the data rate divided by two. In these circumstances, the spacing of the phase signals may be generated based on a half period of the clock, and more specifically may be equal to the spacing between two data samples. The frequency of the phase signals may then correspond to a predetermined fixed ratio of the data rate decided at the time of circuit design. For a 40 Gbps data rate, for example, 8 elementary sampling circuits controlled by 8 phase signals spaced by 25 ps and having a frequency of at 500 MHz each may be used. Another example involves using 16 elementary sampling circuits controlled by 16 phase signals at 250 MHz. Those skilled in the art can appreciate that other numbers of sampling units/phase signals may be generated if desired. Once their phases and frequencies have been generated, the clock signals are used to control the manner in which the incoming data stream is sampled.

The sampling unit includes a plurality of elementary samplers for sampling the incoming data stream at different times. Preferably, the number of samplers equals the number of clock phases generated by the clock signal generator. However, a different number may be used if desired. Once the clock signals have been generated, they are input into the samplers in predetermined combinations along with the data stream.

In the embodiment shown in FIG. 1, consecutive overlapping pairs of clock signals are input into the samplers. Sampler $5_1$, for example, receives clock signals having phases #1 and #2, which equal 0° and 45° respectively when N equals 8. Sampler $5_2$ receives clock signals having phases #2 and #3, which equal 45° and 90° for the same value of N. This pattern continues until the last sampler $5_N$ receives clock signals having phases #N−1 and #N. While consecutive overlapping pairs are preferable, a different number or combination of clock signals may be input into each of the samplers. For example, three clock signals (i.e., three different phases) may be input into each sampler if desired. Under these circumstances, a different spacing between the phases would be required.

Figure 2:
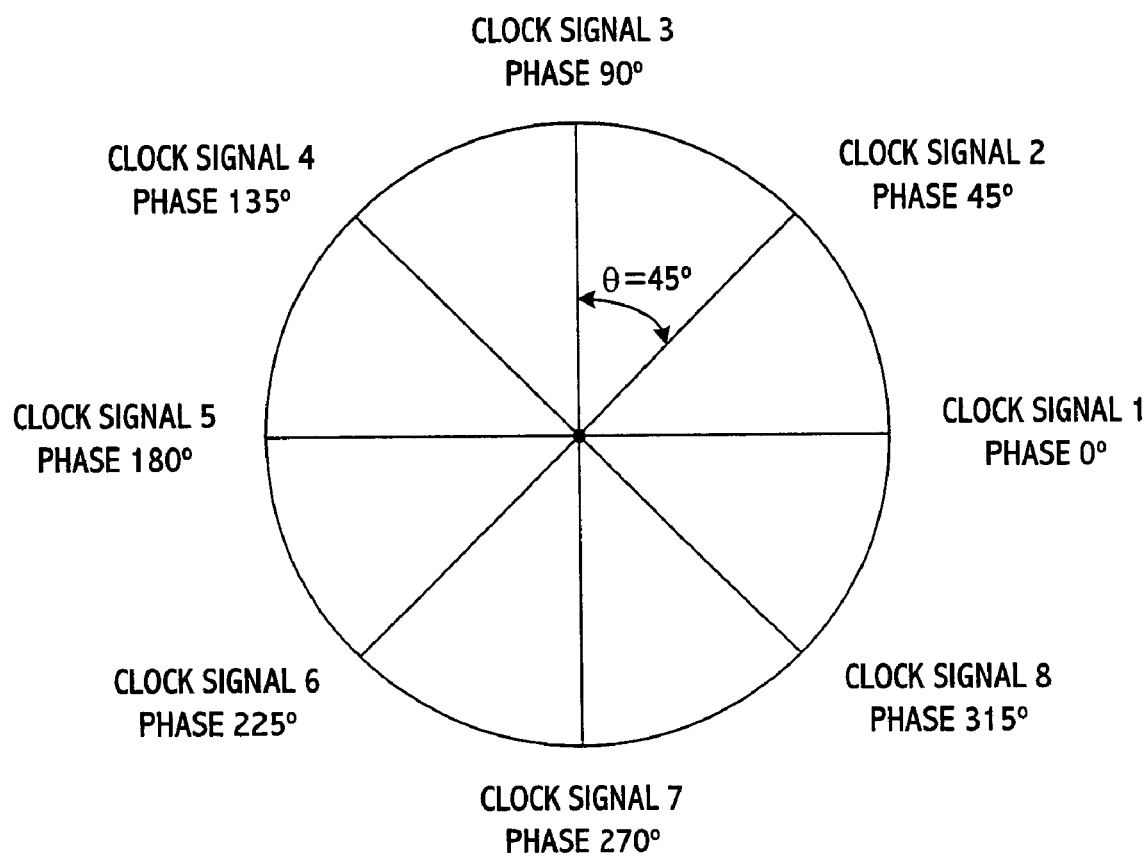
FIG. 2 is a phase chart showing one way in which phases of the clock signals generated in the sampling system of FIG. 1 may be spaced.
Figure 3:
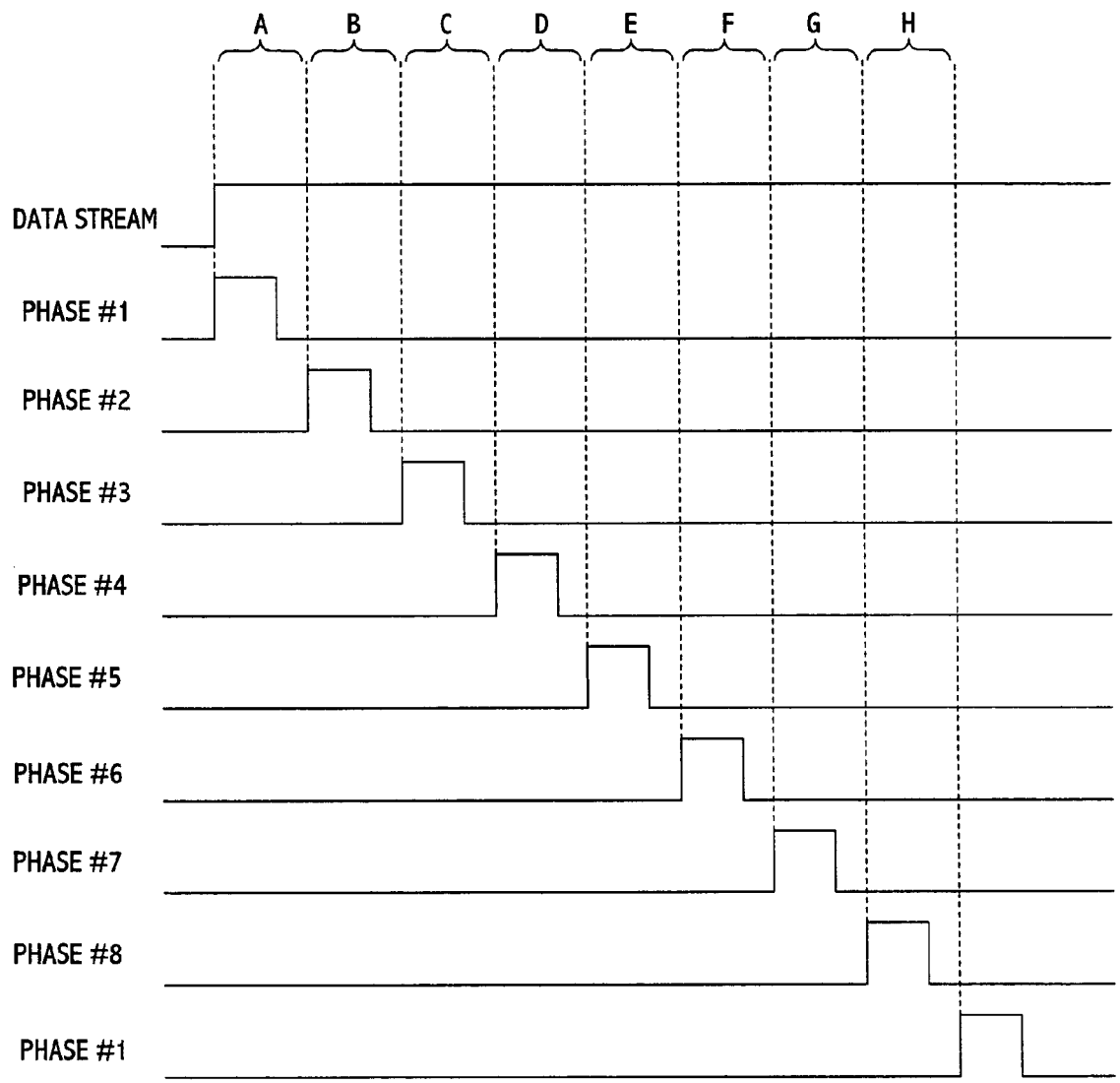
FIG. 3 is a timing chart showing one way in which clock signal phases may be used to control sampling of a data stream in accordance with the first embodiment of the present invention.

FIG. 3 is a timing chart showing one way in which the data stream may be sampled using the clock signals output from the clock signal generator. While the values in this timing chart are based on the clock phases (e.g., number of phases N=8) shown in FIG. 2, neither these values nor the phase chart of FIG. 2 is intended to limit the scope of the embodiments of the present invention described herein. On the contrary, as those skilled in the art can appreciate values other than N=8 and combinations of clock phases other than two may just as easily be used to control the sampling of the data stream.

As previously indicated, each sampler samples the data stream in accordance with two consecutive clock signal phases they receive. In FIG. 3, these clock phases are shown relative to the data stream as having rising and falling edges and the sampling periods for the samplers shown in FIG. 2 are respectively shown as periods A through H. In operation, sampler $5_1$ starts sampling the data stream on the rising edge of clock phase #1 and ends its sampling period at the rising edge of clock phase #2. Sampler $5_2$ starts sampling the data stream on the rising edge of clock phase #2 and ends its sampling period at the rising edge of clock phase #3. This pattern continues until all the samplers sample the data stream over 360°, where sampling may end at that time or another sampling cycle may begin.

Figure 4:
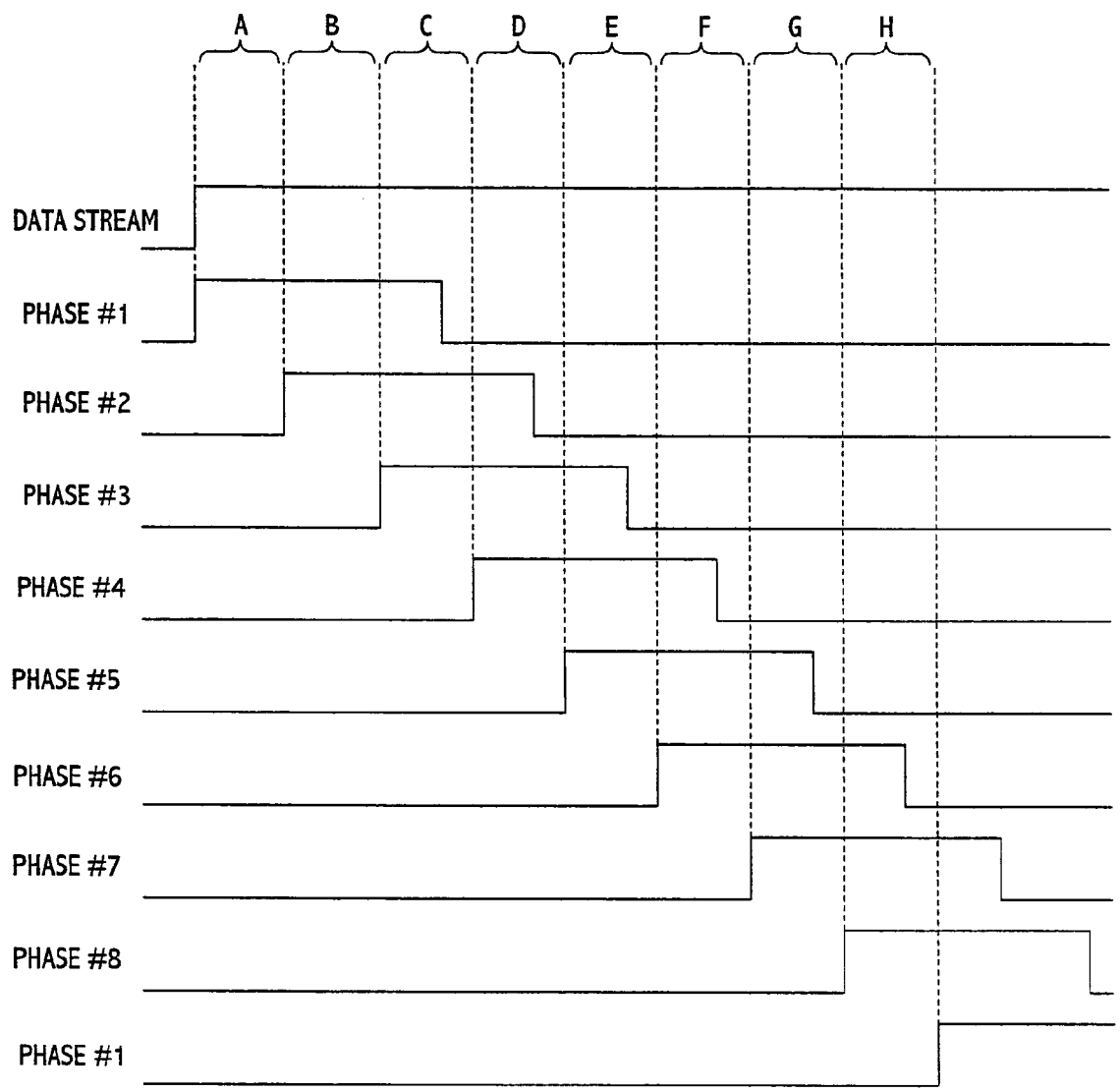
FIG. 4 is a timing chart showing another way in which clock signal phases may be used to control sampling of a data stream in accordance with the first embodiment of the present invention.

FIG. 4 is a timing chart showing another way in which the data stream may be sampled using the clock signals output from the clock signal generator. While the values in this timing chart are based on the clock phases (e.g., number of phases N=8) shown in FIG. 2, neither these values nor the phase chart of FIG. 2 is intended to limit the scope of the embodiments of the present invention described herein. On the contrary, as those skilled in the art can appreciate values other than N=8 and combinations of clock phases other than two may just as easily be used to control the sampling of the data stream.

As previously indicated, each sampler samples the data stream in accordance with two consecutive clock signal phases they receive. In FIG. 4, these clock phases are shown relative to the data stream as having rising and falling edges and the sampling periods for the samplers shown in FIG. 2 are respectively shown as periods A through H. The phases shown in FIG. 4 have duty cycles which do not equal 50% and in fact are overlapping. Because of this overlapping relationship, the timing chart of FIG. 4 may be more suitable for use with the data sampler shown in FIG. 6, discussed in greater detail below. Also, while the sampling periods in FIGS. 3 and 4 have been defined based on the rising edges of the clock signal phases, the falling edges may be used if desired. During this sampling process, the sampled signals output from each sampler may be combined to form a digital representation of the data stream.

Figure 5:
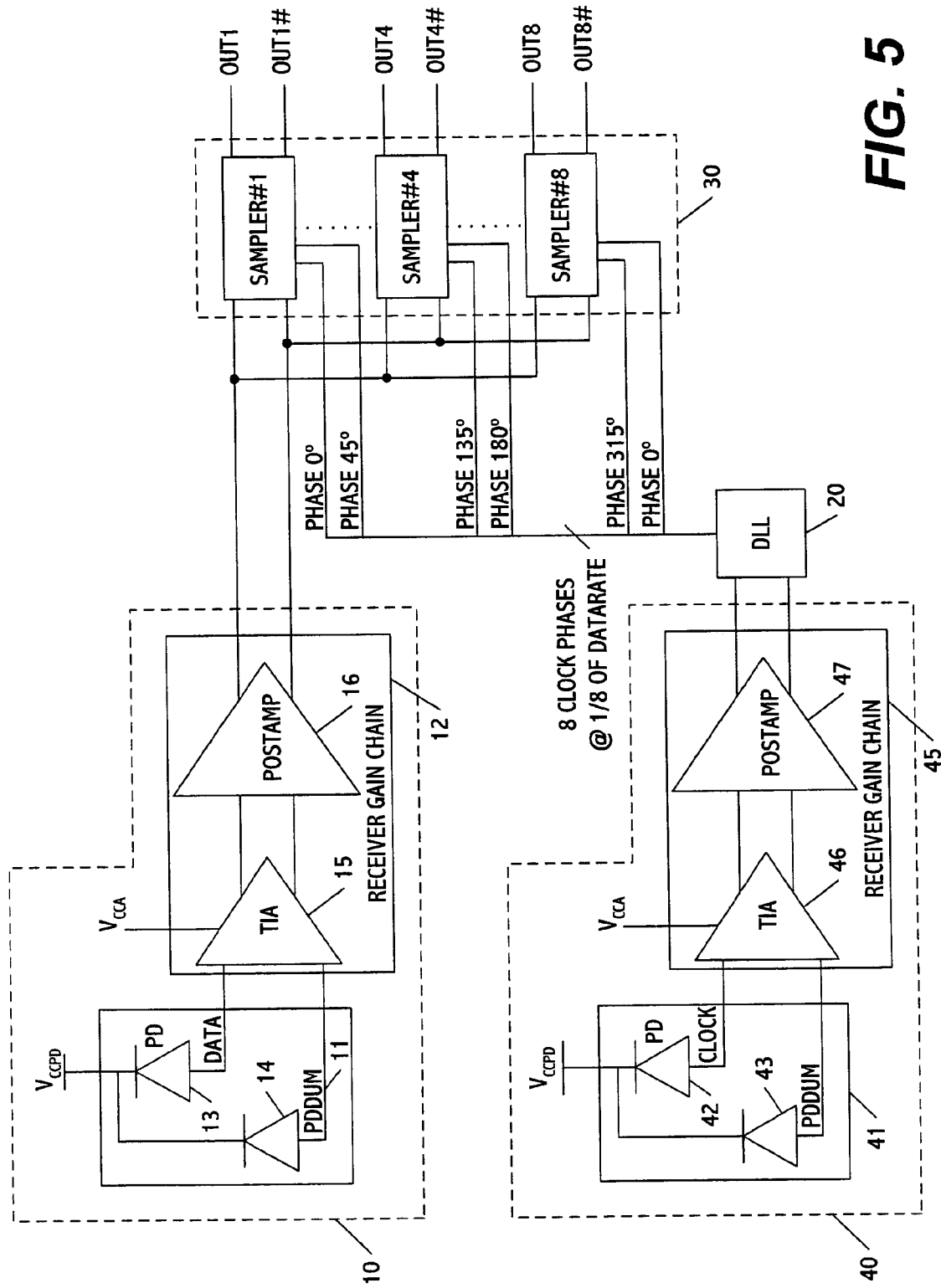
FIG. 5 is diagram showing a system for sampling a data stream in accordance with a second embodiment of the present invention.

FIG. 5 shows a system for sampling a data stream in accordance with a second embodiment of the present invention. This system may be implemented to perform high-speed data sampling for an optical interconnect application, including but not limited to one capable of transmitting a data stream, for example, at a rate of 20 Gb/s or more using CMOS technology having transistor channel lengths that are 0.18 μm or less. Applications of this type may be used, for example, in connection with SONET/SDH transmission systems as well as other and/or faster types of optical systems.

The sampling system of the second embodiment includes an optical interconnect structure 10, a clock signal generator 20, and a sampling unit 30, each of which are preferably formed on a differential optical transceiver chip. If desired, however, one or more of these elements may be provided in a separate chip or circuit. The optical interconnect structure includes at least one conversion unit 11 and a receiver gain chain 12. The conversion unit includes first and second photodiodes 13 and 14, each of which receives an optical signal including at least one data stream from a fiber line. The first photodiode converts the optical signal into an electrical signal for input into the receiver gain chain, and the second photodiode is a dummy photodiode which performs the function of impedance balancing for the differential receiver structure.

The receiver gain chain includes at least one amplifier unit for amplifying the data stream received from the conversion unit. While many amplifier configurations are possible, the amplifier unit preferably includes a transimpedance (TIA) amplifier 15 and a post amplifier 16 connected in series. The TIA includes one or more stages each powered by a supply voltage $V_{cca}$. ($V_{ccPD}$ is a supply voltage used to bias the photodiodes). The stages operate to amplify the signal output from the photodiode (which contains the data stream) using a predetermined gain to generate a differential signal. The differential signal is then amplified a second time by the post amplifier prior to sampling.

The sampling system may also include a second optional interconnect structure 40 having a conversion unit 41 and a receiver gain chain 45. The conversion unit includes photodiode 42 and dummy photodiode 43 and the receiver gain chain includes TIA 46 and post amplifier 47. Optical interconnect structure 40 operates in a manner similar to interconnect structure 10, except that instead of processing a data stream interconnect structure 40 converts an optical clock signal received over a separate channel into an electrical signal and then amplifies it. The optical clock signal is preferably synchronized with the data stream and transmitted to the optical interconnect structure on the same or a different fiber line. The same power supply $V_{cca}$ may be used to power the second interconnect structure.

While separate interconnect structures are used to process the data and clock signals in the embodiment of FIG. 5, a single interconnect structure (e.g., interconnect structure 10) may be used to process both signals if desired. Using one interconnect structure would be advantageous in terms of achieving improved integration through a reduction in chip area and by realizing lower power requirements.

The clock signal generator is preferably in the form of a delay-locked loop (DLL) which generates a plurality of clock signals with differing phases based on a reference clock signal output from the second interconnect structure. To illustrate operation of the second embodiment of the present invention, the DLL is shown as generating clock signals with eight different phases equally spaced in a manner similar to the scheme shown in the chart of FIG. 2. As with the first embodiment, different numbers of phases and different phase spacings may be used to satisfy, for example, the particular application of the sampling system. For the exemplary case where eight phases are generated, the DLL may set the frequency of each clock signal to ⅛ the data rate frequency of the data stream.

The sampling unit includes a number of independent samplers preferably equal to the number of clock phases generated by the delay-locked loop. The clock phase signals generated by the DLL are input into the samplers in predetermined combinations to control sampling of the data stream. As shown, this may involve inputting consecutive overlapping pairs of clock phases into the samplers, which would then sample the data stream in a manner similar to that shown in either of the timing charts of FIGS. 3 and 4. Using this scheme and more specifically the equal spacings among the clock phases advantageously results in the spacing between the rising or falling edges of consecutive overlapping pairs of the clock phases to be exactly equal to the symbol duration, e.g., the duration during which each piece of data transferred in the stream in present.

For example, for a 20 Gbps data stream, each data symbol is present during 50 ps at the input of the sampler, since 20 billion data symbols (bits of information) are transferred per second in a 20 Gbps data stream. In order to correctly capture each data symbol, it is preferred that the spacing in time between the phases be identical to the symbol duration. Otherwise, the capture of data in the stream may occur out of synchronization, which may lead to incorrect data sampling. While the number of samplers is shown to equal the number of clock phases generated by the DLL, this number can be different. For example, a lower number of samplers may be used for lower data rates and a higher number of samplers may be used for higher data rates.

Figure 6:
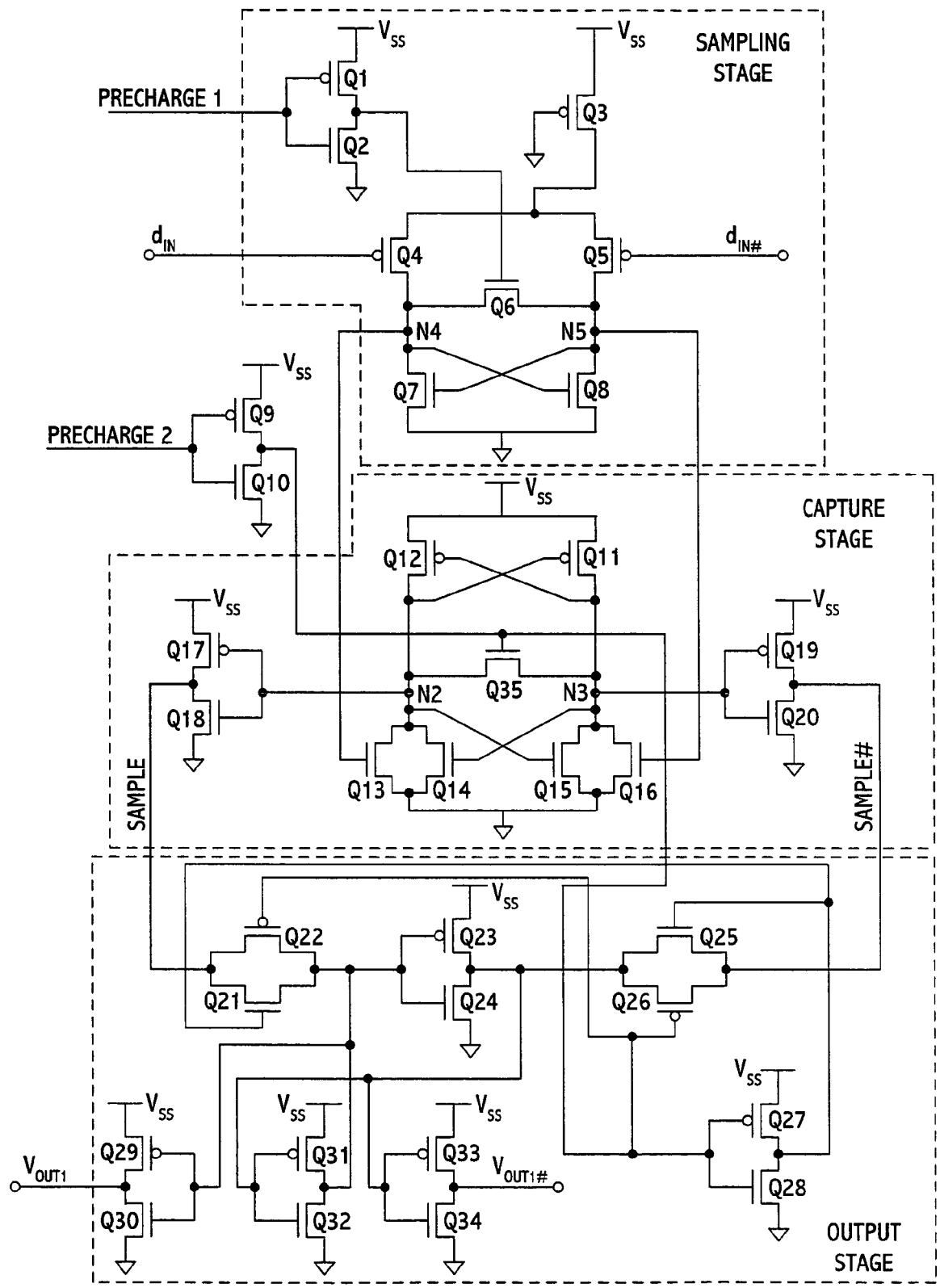
FIG. 6 shows one possible configuration of a data sampler that may be used in any of the embodiments of the data sampling system of the present invention.

FIG. 6 shows one possible configuration of a data sampler that may be used in any of the embodiments of the data sampling system of the present invention. The sampler includes three stages: a sampling stage, a data capture stage, and an output stage. The first stage includes a reset circuit formed from transistors Q1, Q2, and Q6, a bias circuit formed from transistor Q3, and a differential sampling circuit formed from transistors Q4 through Q8. Gates of transistors Q1 and Q2 are connected to a precharge line which corresponds to one of the clock phase signals generated in accordance with the embodiments of the present invention. For illustrative purposes, the precharge line is labeled "precharge 1" to indicate that it corresponds to the first phase (e.g., phase 0°) output from delayed-locked loop of FIG. 5.

Transistors Q4 and Q5 are connected by their gates to data input terminals for respectively receiving data signal (din) and its complement (din#)(differential signal), which are the signals to be sampled. Transistor Q6 controls when these signals are sampled based on the output of transistors Q1 and Q2, and cross-coupled transistors Q7 and Q8 perform the function of amplifying the data signals.

The data capture stage samples and stores the data signals input through the din and din# terminals. The sampled data is acquired between the time the precharge 1 (first clock phase) signal is asserted and the time the precharge 2 (second clock phase) signal is asserted. The captured data, labeled SAMPLE and SAMPLE#, is respectively stored in cross-coupled inverter storage circuits formed from transistors Q23/Q24 and Q31/Q32, after being buffered (and inverted) by transistors Q17/Q18 and Q19/Q20 respectively. Transistor pairs Q21/Q22 and Q25/Q26 respectively form pass-gate devices which write the sampled data in the latch circuits formed by Q21-Q26, Q31, and Q32.

When Q35 is switched off, the data signals din and din# are respectively sampled by transistor pairs Q13/Q14 and Q15/Q16. As shown, these transistor pairs are in a cross-coupled configuration, where the gate of Q13 is connected to node N4 between transistors Q4 and Q7 and the gate of Q16 is connected to node N5 between transistors Q5 and Q8. The cross-coupling of these transistor pairs perform data amplification and saturation functions.

A reset circuit is formed from transistors Q9, Q10, and Q35 for the capture stage. Gates of these transistors are connected to precharge line 2 which, for example, corresponds to a second one of the clock phases output by the DLL of FIG. 4. This signal may correspond to the 45° phase. Transistor Q35 acts as a reset before the data input on the gates of transistors Q13 and Q16 are captured. Transistor pairs Q17/Q18 and Q19/Q20 form inverting buffers for sending the captured data into the latch included in the output stage. Transistors Q11 and Q12 perform amplification and saturation functions with hysteresis of the captured data.

The output stage outputs the sampled data stored in the data capture stage when the precharge 2 signal is asserted. More specifically, SAMPLE is output through terminal $V_{OUT1}$ and SAMPLE# is output through terminal $V_{OUT1\#}$ when the precharge 2 signal goes high. In the output stage, transistors Q21-Q26, Q31, and Q32 form a static latch for storing both the SAMPLE data and the SAMPLE# data. In this latch, transistor pairs Q23/Q24 and Q27/Q28 respectively form inverter circuits for inverting the stored data and to control the two pass-gates of the latch. Transistor pairs Q29/Q30, Q31/Q32, and Q33/Q34 also form inverters.

Output terminals $V_{OUT1}$ and $V_{OUT1\#}$ are connected to nodes A and B between transistor pairs Q29/Q30 and Q33/Q34 respectively. While both NMOS and PMOS transistors have been used to form the circuit of FIG. 6, those skilled in the art can appreciate that other transistor technologies may be used if desired.

Figure 7:
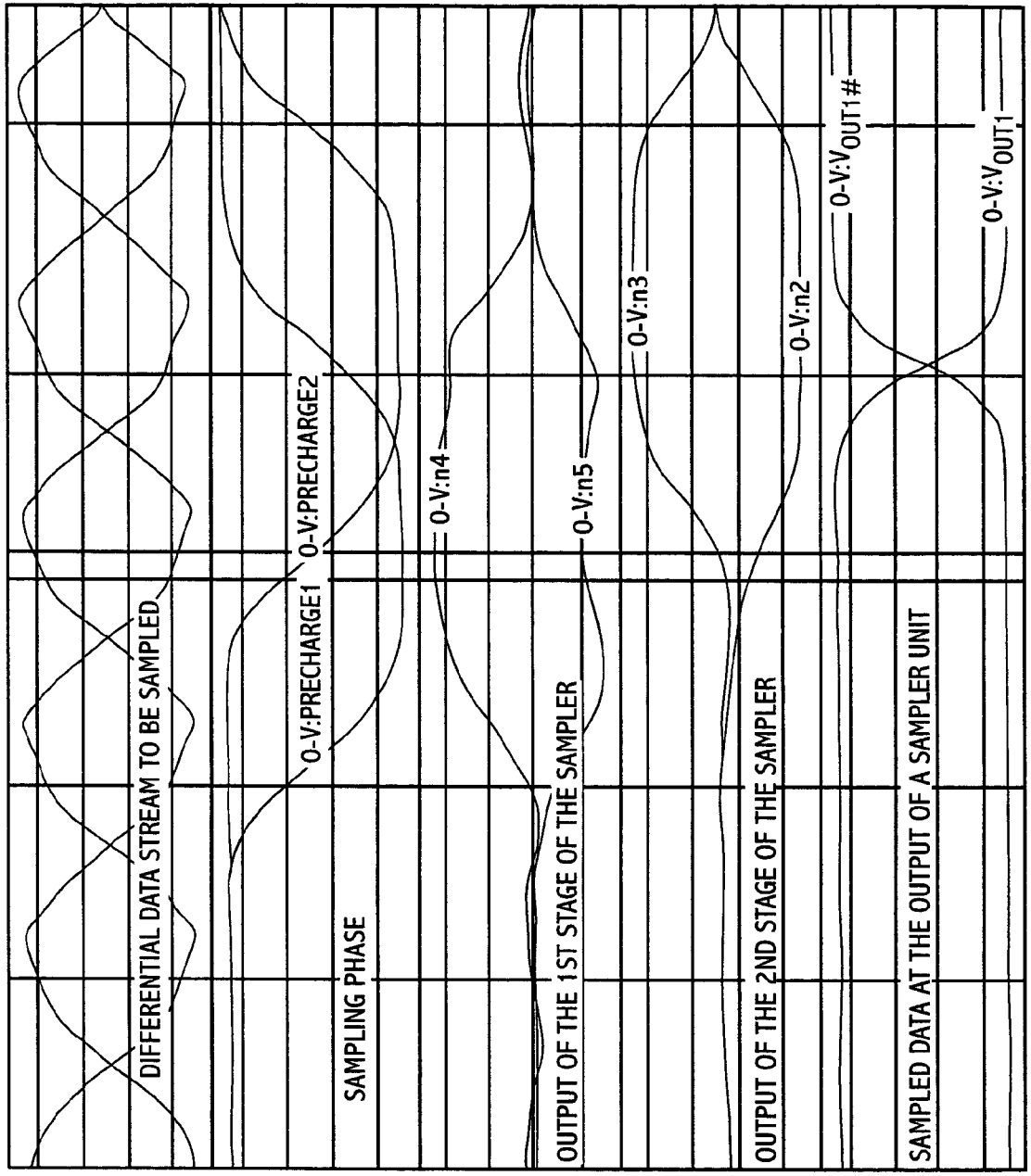
FIGS. 7(a)-7(e) are graphs showing input waveforms and signals used during an illustrative simulation of the data sampler shown in FIG. 6.

FIGS. 7(a)-(e) are graphs showing the manner in which the sampler operates in accordance with one illustrative embodiment of the present invention. FIG. 7(a) shows waveforms corresponding to differential data streams to be sampled, e.g., din and din#. FIG. 7(b) shows waveforms corresponding to the precharge 1 and precharge 2 (e.g., consecutive clock phase signals) output from the DLL. FIG. 7(c) shows the signals output from the first stage of the sampler, which in this case are the signals output from nodes N4 and N5 respectively. FIG. 7(d) shows the signals output from the second stage of the sampler, which in this case are the signals output from nodes N2 and N3 respectively from which SAMPLE and SAMPLE# are derived. FIG. 7(e) shows the signals output from the output stage, which correspond to $V_{OUT1}$ and $V_{OUT1\#}$ respectively.

In operation, the first stage is set into an unstable state when the clock phase signal present at the precharge 1 signal line is low. (It is to be understood that the simulated waveforms in FIGS. 7(a)-(e) are inverted compared to circuit configuration shown in FIG. 6 because of an additional inverter stage that has been added to the circuit for its operation in the test chip from where the simulation was taken). When the precharge 1 clock signal is switched to a high level, the cross-coupled transistor pair Q7/Q8 switch based on the voltages present at the differential data inputs din and din#. A very small voltage differential is necessary to destabilize the fragile equilibrium and this differential is automatically amplified by the cross-coupled transistor structure formed by Q7 and Q8. The data signals are then input into the data capture stage from nodes N4 and N5.

The data capture stage captures the state of the data output from the first stage when the clock phase signal input into signal line precharge 2 goes low. (Nodes N4 and N5 are set in an unstable intermediary state when precharge 1 is low). The data capture stage captures a sample from din and din# after one symbol duration, under conditions where the two clock phase signals input into the precharge 1 and precharge 2 lines are spaced exactly 45° from one another.

The output stage temporarily stores the sampled data, SAMPLE and SAMPLE#, in the static latch circuit formed by transistors Q21-Q26, Q31, and Q32. This storage function is performed when the first clock phase signal on precharge line 2 returns to a high level. The sampled signals are then output from terminals $V_{OUT1}$ and $V_{OUT1\#}$ when the second clock phase signal on precharge line 2 returns to a low level.

The waveforms and signals shown in the graphs of FIGS. 7(a) to 7(e) were used in a simulation performed in the illustrative case of where the circuit was operating on a 20 Gb/s data stream. Those skilled in the art can appreciate that other values may be used if desired.

Figure 8:
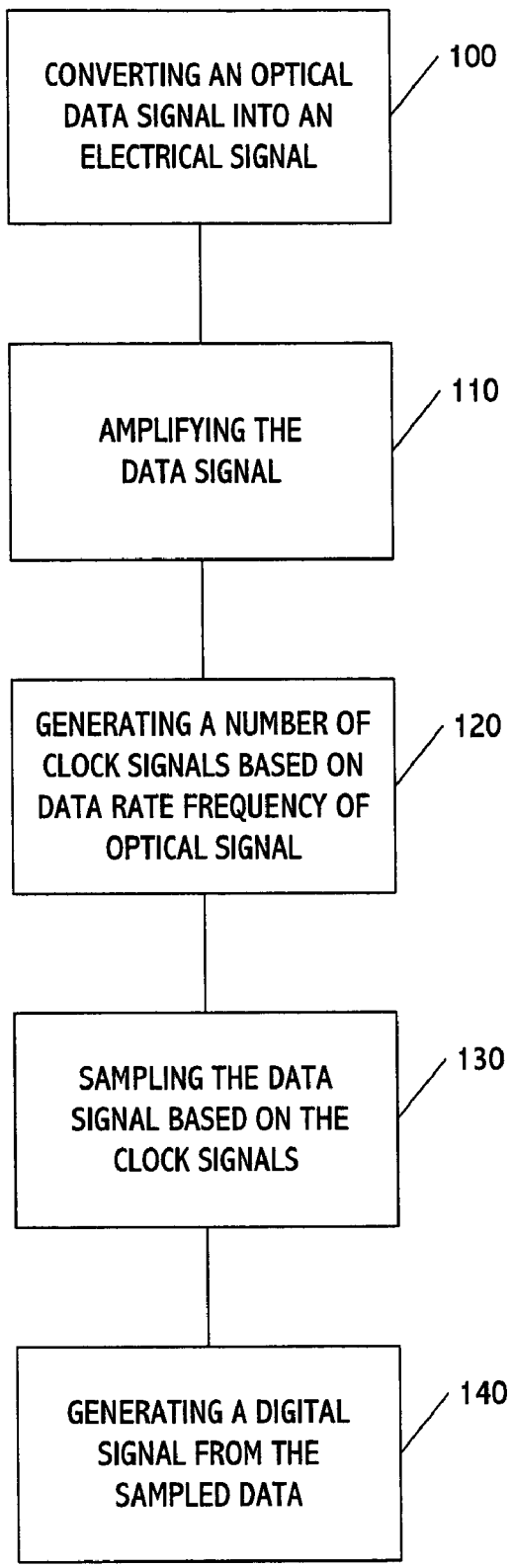
FIG. 8 is a flow chart showing blocks included in one embodiment of a method for sampling data in accordance with the present invention.

FIG. 8 is a flow chart showing blocks included in one embodiment of a method for sampling data in accordance with the present invention. The method includes converting an optical signal containing a data stream into an electrical signal containing the data stream. (Block 100). The electrical signal is then amplified by a predetermined amount so that it can be processed. (Block 110). A number of clock signals are then generated based on the data rate frequency of the data stream. (Block 120). The clock signals are preferably generated to have equally spaced phases, with each phase being determined by a predetermined fraction of the data rate frequency. The equal spacing of the clock signal phases may equal a symbol duration of the data stream. Once the clock signals have been generated, the data stream is sampled using predetermined combinations of the clock signals. (Block 130). The combinations may include consecutive overlapping pairs of the clock signals, each defining a separate period during which the data stream is sampled. The separately sampled data is then combined to form a digital signal representing the data stream. (Block 140).

Figure 9:
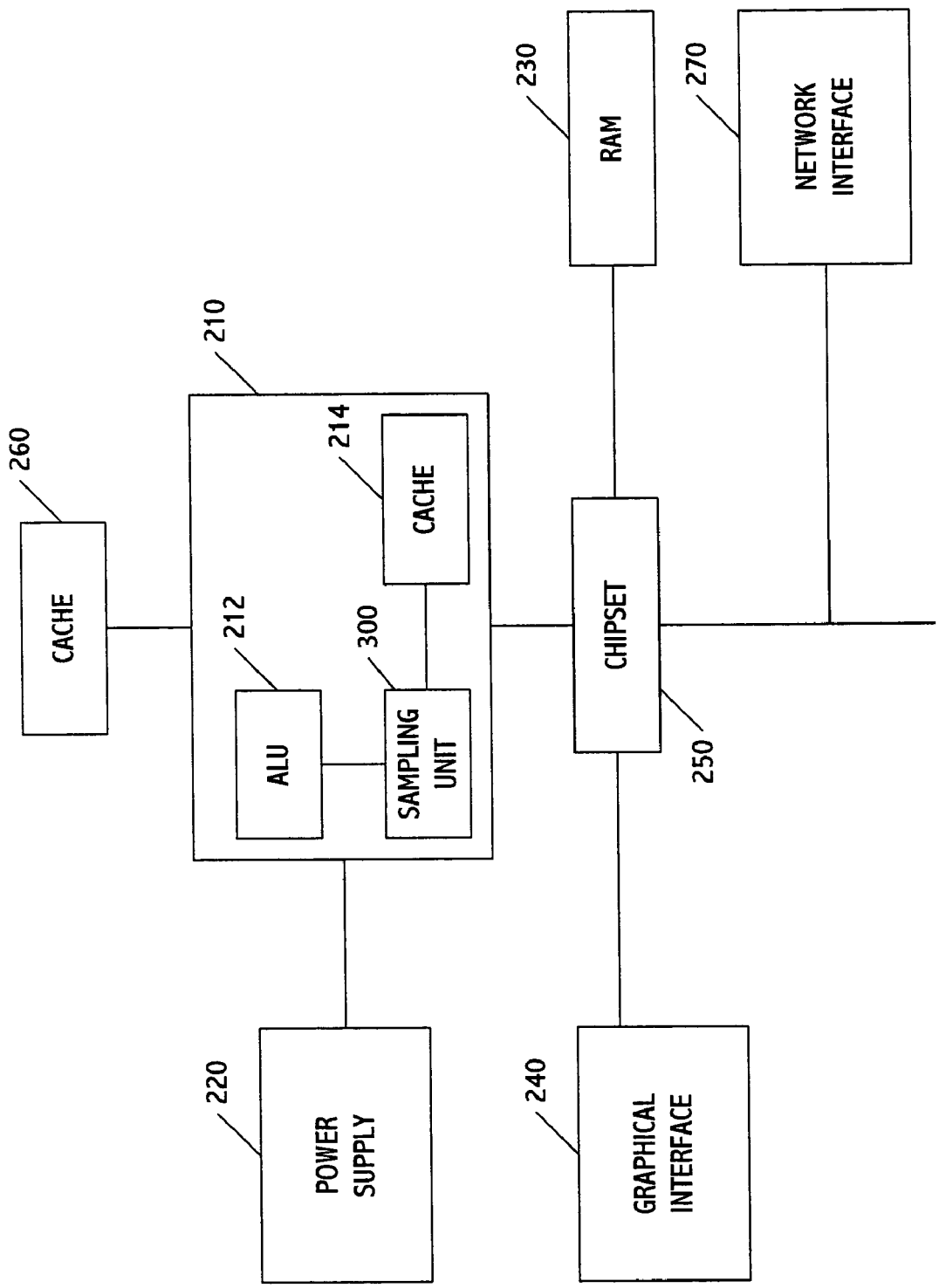
FIG. 9 is a diagram showing a processing system which may incorporate one or more embodiments of the sampling system or data sampler of the present invention.

FIG. 9 is a diagram showing a processing system which may incorporate one or more embodiments of the sampling system or data sampler of the present invention. The processing system includes a processor 210, a power supply 220, and a memory 230 which, for example, may be a random-access memory. The processor may include an arithmetic logic unit 212 and an internal cache 214. The system may also include a graphical interface 240, a chipset 250, a cache 260 and a network interface 270. In an optical interconnection application, the sampling system or data sampler 300 may be included in the processor (e.g., on the same chip or die) for converting and then sampling an input optical data stream. The sampling system or data sampler may be included in the processor or one or more of other elements of the processing system to meet the requirements of other applications of the system.

A system and method for sampling data in accordance with the foregoing embodiments are advantageous in a number of respects. For example, using multiple clock phases at lower frequencies (e.g., a predetermined fraction of the data rate frequency) relaxes speed constraints for operation of the samplers themselves. Also, even though sampling must be performed with a very high precision, using clock signals of this type provides more time for voltage to develop in the sampler, thereby enabling the circuit shown in FIG. 5 to be implemented where the sampled data is available for output only after 2 symbol durations. These clock signals also automatically provide 1-to-N demultiplexing, where N equals the number of clock phases generated. This, in turn, eases further deserializing operations which can be performed at even lower frequencies after the sampling.

Other modifications and variations to the embodiments of the invention will be apparent to those skilled in the art from the foregoing disclosure. Thus, while only certain embodiments of the invention have been specifically described herein, it will be apparent that numerous modifications may be made thereto without departing from the spirit and scope of the invention. For example, application of the systems and methods described herein is not intended to be limited to any particular data speed range. Rather, these systems and methods are sufficiently flexible so that they may be used to sample data streams that are transmitted at low speeds (e.g., <20 Gb/s) as well as higher speeds (>20 Gb/s).

We claim:

1. A system, comprising:
a clock generator to generate a number of clock signals having equally spaced phases determined by a predetermined fraction of a data rate frequency of a data stream; and
a sampling unit to sample the data stream based on the clock signals, wherein the sampling unit includes a number of samplers which are to sample the data stream based on different combinations of the clock signals.

2. The system of claim 1, wherein each of the clock signals has a frequency determined by the predetermined fraction of the data rate frequency of the data stream.

3. The system of claim 2, wherein the predetermined fraction is N, the equal phase spacing of the clock signals is 360°/N, and the frequency of each clock signal is equal to 1/N of the data rate frequency of the data stream.

4. The system of claim 1, wherein each sampler samples the data stream based on a different pair of the clock signals.

5. The system of claim 1, wherein the number of samplers equals to the number of clock signal phases generated by the clock generator.

6. The system of claim 1, wherein the number of samplers and the number of clock signal phases generated by the clock generator are different.

7. The system of claim 1, wherein each of the samplers sample the data stream based on a different pair of clock signals having consecutive phases.

8. The system of claim 1, further comprising:
a converter to convert an optical data stream into an electrical data stream,
wherein the sampling unit samples the electrical data stream based on the clock signals.

9. The system of claim 8, wherein the data rate frequency is a data rate frequency of the optical data stream sampled by the sampling unit.

10. The system of claim 1, wherein the samplers sample the data stream based on sampling signals that are generated by different pairs of the clock signals.

11. The system of claim 10, wherein consecutive pairs of the clock signals share a common clock signal.

12. The system of claim 10, wherein the clock signals in each pair have consecutive phases.

13. The system of claim 12, wherein the sampling signals having non-overlapping duty cycles.

14. The system of claim 12, wherein the sampling signals have overlapping duty cycles.

15. The system of claim 12, wherein the clock signals in each pair define different edges of corresponding ones of the sampling signals.

16. The system of claim 12, wherein the sampling signals have duty cycles which are substantially different from 50%.

17. A comprising:
a clock generator to generate a number of clock signals having equally spaced phases determined by a predetermined fraction of a data rate frequency of a data stream; and
a sampling unit to sample the data stream based on the clock signals, where the equal spacing of the clock signal phases corresponds to a symbol duration of the data stream.

18. A data sampling method, comprising:
generating a number of clock signals having equally spaced phases, each of said phases determined by a predetermined fraction of a data rate frequency of a data stream; and
sampling the data stream based on the clock signals, wherein sampling the data stream includes sampling the data stream based on different combinations of the clock signals.

19. The method of claim 18, wherein each of the clock signals has a frequency determined by the predetermined fraction of the data rate frequency of the data stream.

20. The method of claim 19, wherein the predetermined fraction is N, the equal phase spacing of the clock signals is 360°/N, and the frequency of each clock signal is equal to 1/N of the data rate frequency of the data stream.

21. The method of claim 18, wherein sampling the data stream includes: sampling the data stream based on a different pair of the clock signals.

22. The method of claim 21, wherein the different pair includes clock signals having consecutive phases.

23. The method of claim 18, wherein sampling the data stream includes: sampling the data stream using a number of samplers equal to the number of generated clock signal phases.

24. The method of claim 18, further comprising:
converting an optical data stream into an electrical data stream, wherein sampling the data stream includes sampling the electrical data stream based on the different combinations of the clock signals.

25. The method of claim 24, wherein the data rate frequency is a data rate frequency of the optical data stream.

26. A data sampling method comprising:
generating a number of clock signals having equally spaced phases, each of said phases determined by a predetermined fraction of a data rate frequency of a data stream; and
sampling the data stream based on the clock signals, wherein sampling the data stream includes: sampling the data stream using a number of samplers different from the number of generated clock signal phases.

27. A data sampling method comprising:
generating a number of clock signals having equally spaced phases, each of said phases determined by a predetermined fraction of a data rate frequency of a data stream; and
sampling the data stream based on the clock signals, where the equal spacing of the clock signal phases corresponds to a symbol duration of the data stream.

28. A data sampler, comprising:
a sampling stage to sample data based on clock signals having different phases; and
a buffer to stored the sampled data, wherein the difference between the phases of the clock signals at least substantially equals a symbol duration of the data.

29. The data sampler of claim 28, wherein the buffer includes a static latch.

30. A method, comprising:
sampling a data stream based on clock signals having different phases; and
storing the sampled data in a storage circuit, wherein the difference between the phases of the clock signals at least substantially equals a symbol duration of the data.

31. The method of claim 30, wherein the storage circuit includes a static latch.

32. A system, comprising:
a processor; and
a sampling unit including:
(a) a clock generator to generate a number of clock signals having equally spaced phases determined by a predetermined fraction of a data rate frequency of a data stream; and
(b) a sampling unit to sample the data stream based on the clock signals, wherein the sampling unit includes a number of samplers which are to sample the data stream based on different combinations of the clock signals.

33. The system of claim 32, where the equal spacing of the clock signal phases corresponds to a symbol duration of the data stream.

34. A system comprising:
a clock generator to generate a number of clock signals having equally spaced phases determined by a predetermined fraction of a data rate frequency of a data stream; and
a sampling unit to sample the data stream based on the clock signals, wherein the sampling unit includes a plurality of samplers which sample the data stream based on different pairs of the clock signals that have consecutive overlapping phases.

* * * * *